United States Patent [19]
Altshuler

[11] Patent Number: 5,597,459
[45] Date of Patent: Jan. 28, 1997

[54] MAGNETRON CATHODE SPUTTERING METHOD AND APPARATUS

[75] Inventor: Alexander Altshuler, Pawtucket, R.I.

[73] Assignee: Nobler Technologies, Inc., Avon, Mass.

[21] Appl. No.: 385,868

[22] Filed: Feb. 8, 1995

[51] Int. Cl.[6] .................................................. C23C 14/35
[52] U.S. Cl. .................. 204/192.12; 204/298.09; 204/298.11; 204/298.12; 204/298.16; 204/298.19
[58] Field of Search ................... 204/192.12, 298.16, 204/298.17, 298.18, 298.19, 298.09, 298.12, 298.11

[56] References Cited

U.S. PATENT DOCUMENTS

| | | | |
|---|---|---|---|
| 2,146,025 | 2/1939 | Penning | 204/192.12 |
| 3,956,093 | 5/1976 | McLeod | 204/192.12 |
| 4,162,954 | 7/1979 | Morrison, Jr. | 204/298.19 |
| 4,166,018 | 8/1979 | Chapin | 204/192.12 |
| 4,180,450 | 12/1979 | Morrison, Jr. | 204/298.19 |
| 4,312,731 | 1/1982 | Morrison, Jr. | 204/192.12 |
| 4,434,042 | 2/1984 | Keith | 204/298.09 |
| 4,444,643 | 4/1984 | Garrett | 204/298.2 |
| 4,486,287 | 12/1984 | Fournier | 204/192.12 |
| 4,714,536 | 12/1987 | Freeman et al. | 204/298.2 |
| 4,826,584 | 5/1989 | dos Santos Pereiro Ribeiro | 204/298.09 |
| 4,834,860 | 5/1989 | Demaray et al. | 204/298.18 |
| 4,865,708 | 9/1989 | Welty | 204/192.12 |
| 4,871,433 | 10/1989 | Wagner et al. | 204/192.12 |
| 4,872,964 | 10/1989 | Saxuki et al. | 204/298.2 |
| 4,891,560 | 1/1990 | Okamura et al. | 315/111.41 |
| 4,892,633 | 1/1990 | Welty | 204/192.12 |
| 4,933,064 | 6/1990 | Geisler et al. | 204/298.17 |
| 4,964,968 | 10/1990 | Arita | 204/298.19 |
| 4,995,958 | 2/1991 | Anderson | 204/298.2 |
| 5,069,772 | 12/1991 | Fritsche et al. | 204/298.12 |
| 5,085,755 | 2/1992 | Setoyama et al. | 204/298.16 |
| 5,106,474 | 4/1992 | Dickey et al. | 204/298.14 |
| 5,108,846 | 4/1992 | Steininger | 428/694 |
| 5,112,467 | 5/1992 | Zejda | 204/298.12 |
| 5,133,850 | 7/1992 | Kukla et al. | 204/298.12 |
| 5,174,880 | 12/1992 | Bourez et al. | 204/298.17 |
| 5,196,105 | 3/1993 | Feuerstein et al. | 204/298.19 |
| 5,259,941 | 11/1993 | Münz | 204/298.09 |
| 5,262,028 | 11/1993 | Manley | 204/192.12 |
| 5,269,894 | 12/1993 | Kerschbaumer | 204/192.12 |

FOREIGN PATENT DOCUMENTS

| | | | |
|---|---|---|---|
| 0493647A1 | 7/1992 | European Pat. Off. | H01J 37/32 |
| 0676791A1 | 10/1995 | European Pat. Off. | H01J 37/34 |
| 3-170668 | 7/1991 | Japan | 204/298.19 |
| 2090872 | 9/1981 | United Kingdom | 204/298.19 |
| 2096177 | 10/1982 | United Kingdom | C23C 15/00 |

Primary Examiner—Aaron Weisstuch
Attorney, Agent, or Firm—Wolf, Greenfield & Sacks, P.C.

[57] ABSTRACT

A magnetron sputtering cathode assembly provides an annular target of sputtering material located with a sputtering surface facing a substrate to be sputtered. An inner magnet and an outer ring magnet are positioned adjacent inner and outer edges of the sputtering surface. The outer ring magnet is oriented so that its North-to-South magnetic orientation is substantially parallel to the plane defined by the sputtering surface while the inner magnet is oriented so that its North-to-South magnetic orientation is substantially perpendicular to the plane defined by the sputtering surface. A pair of walls extend at the inner and outer edges of the annular target away from the sputtering surface and toward the substrate. The walls and the magnets define a closed-loop array of radial magnetic lines having improved target erosion and plasma-containing characteristics.

13 Claims, 8 Drawing Sheets 5,597,459

MAGNETRON CATHODE SPUTTERING METHOD AND APPARATUS

FIELD OF THE INVENTION

This invention relates to a method and apparatus for sputtering a target material onto a substrate and more particularly to a magnetron sputtering cathode apparatus having an improved sputtering target and magnet assembly that provides more efficient utilization of the target.

BACKGROUND OF THE INVENTION

Magnetically-enhanced cathode sputtering devices have been used extensively to deposit a thin layer of a target material on a substrate. One common application for such devices is in the manufacture of compact discs (CDs) having a thin layer of aluminum target material along a surface of the polycarbonate substrate disc. Typically, the substrate is located in the presence of a vacuum ($10^{-3}$ Torr) and a small concentration of Argon gas is introduced. The target is energized with a cathode voltage which ionizes the argon and generates a plasma. The target material is atomized by the plasma and is "sputtered" toward the disc, which is adjacent a grounded anode. A basic design for a magnetron sputtering device is disclosed in U.S. Pat. No. 4,166,018. Various improvements on this basic concept have also occurred.

FIG. 1 schematically illustrates a magnetron sputtering device according to the prior art. The device 20 comprises a magnet assembly 22 located adjacent a target 24 along a back surface of the target 26 opposite a substrate 28 to be coated. The magnet assembly 22, according to this example, comprises permanent magnets mounted on a plate of magnetically-permeable material 32. A pair of outer magnet rows 30 surround an inner magnet row 34. The outer rows 30 are generally joined together at their ends by curved sections (not shown) of magnetic material to form a closed loop around the inner row 34. The outer rows 30 are oriented so that their north poles (N) are adjacent the back surface 26 of the target 24. Similarly, the inner or center row 34 is oriented so that its south pole (S) is most closely adjacent the target's back surface 26. The north-to-south axis of each magnet is, likewise, aligned substantially perpendicularly to the back surface 26 of the target 24.

The location of the magnet rows 30 and 34 and the orientation of their poles N and S generate a magnetic field defined by a series of magnetic flux lines 36 that penetrate the target 24 and that form a closed loop, tunnel-like, arched section 38 over the front or "sputtering" surface 40 of the target. The midsection 42 of the arch 36 is approximately adjacent the sputtering surface 40 and defines flux lines that are substantially parallel to the plane of the sputtering surface 40.

The flat arched section 42 confines the charged plasma in close proximity to the sputtering surface 40. This confinement facilitates the sputtering or projection of material onto a desired portion of the substrate 28. Similarly, the arched section 38 of the magnetic field prevents spreading of the plasma along the target's sputtering surface 40 and maintains the plasma laterally within the area of the arch. Thus, the transfer of sputtered material occurs within a well-defined region of the substrate 28 based upon the shape of the arch.

A disadvantage of sputtering according to FIG. 1 is that the sides 46, 48, 50 and 52 of the magnetic field arch 36 concentrate erosion of sputtering target 24 toward the center of the arch 38 and result in the formation of erosion trenches 54 and 56 in the target that define an approximately V-shaped cross section. Hence, a large portion of target material adjacent the target's center and outer ends remains unused. The uneven erosion necessitates replacement of targets at shorter time intervals than if more of the target were actually sputtered.

The use of thicker targets in the process of FIG. 1 is not generally effective. The thickness of the target is limited by the strength of the magnets. The arch 38 becomes too distant from the magnets and thus the field becomes too weak to properly contain the plasma.

An alternate configuration for a magnetron sputtering apparatus is disclosed in U.S. Pat. No. 4,486,287. This configuration is shown generally in FIG. 2 and can be used for coating of circular CD surfaces. The magnet assembly 51 comprises a pair of concentric inner and outer annular magnets 55 and 57, respectively, centered about an axis 59. The magnets are aligned so that their north and south poles, N and S, respectively, are oriented along an alignment that is parallel to the plane of the target 60 and the plane of the substrate 61.

The target 60 in this example comprises an annular ring of sputtering material having a sputtering surface 62 located adjacent the inner and outer magnets 55 and 57. The magnets 55 and 57 generate a magnetic field defining a plurality of substantially parallel flux lines 64 that are located in front of and behind the sputtering surface of the target 60. The target 60 also includes a pair of concentric confining walls 66 and 68 at the inner and outer edges of the target that enable plasma generated from the sputtering surface 62 to be confined within the area of the flux lines 64 directly adjacent the sputtering surface 62.

The configuration of FIG. 2 enables efficient utilization of the target and facilitates sputtering over the entire target sputtering surface 62. This configuration also enables the use of thicker targets for prolonged sputtering without target replacement. However, orientation of the inner magnet 55 poles N and S parallel to the substrate plane necessitates a relatively large diameter for the inner magnet assembly. The enlarged diameter of the inner magnet reduces the area of the substrate center that can be sputtered effectively. Thus, the magnet configuration of FIG. 2 is sometimes unacceptable when an area close to the center of the substrate 61 must be sputtered.

In view of the disadvantages of the prior art, it is an object of this invention to provide a magnetron sputtering cathode assembly having an increased target life with an improved target erosion pattern. The cathode assembly should be able to accept relatively thick targets and should enable long term use without target replacement or readjustment. The cathode should be able to sputter magnetic materials and nonmagnetic materials and should enable sputtering of a large area of the substrate.

SUMMARY OF THE INVENTION

A magnetron sputtering cathode assembly according to this invention provides a housing that is generally attached to a vacuum chamber. The end of the housing includes an opening typically adapted to receive a substrate which, according to a preferred embodiment, comprises a conventional compact disc (CD). A target constructed, in one embodiment, from 6061 aluminum alloy, is located in a face-to-face relationship with the substrate spaced at a predetermined distance from the substrate. The target defines an annulus having inner and outer edges that are generally circular. The inner edge defines an open center section within which is positioned a magnet assembly according to this invention. The outer edge is adjacent a ring magnet. The target includes a sputtering surface that faces the substrate and that defines a plane. A pair of walls extending from the plane in a direction toward the substrate along each of the inner and outer edges.

The magnets are polarized so that the North-to-South orientation of the inner magnet poles is aligned perpendicularly relative to the plane of the sputtering surface. The North-to-South orientation of the outer magnet poles is aligned parallel relative to the plane of sputtering surface. Both the inner magnet and the outer magnet are positioned so that they are adjacent the plane of the sputtering surface aside each of the inner and outer edges of the target. The magnets are each mounted to a magnetically-permeable material base. The inner and outer magnets define a magnetic closed-loop array of radial flux lines in close proximity to the sputtering surface. The flux lines defined by the magnetic field pass through the walls of the target. The flux lines defined by the field are substantially flat adjacent the sputtering surface.

When the target is energized, a plasma of ionized Argon gas is generated above the target. The plasma is contained with the magnetic field. The geometry of the field serves to maintain an even erosion of sputtering material from the target and the walls of the target prevent undue spread of the plasma outside the edges of the target. This even erosion extends the life of the target and improves efficiency of the sputtering operation.

According to a preferred embodiment, the target includes lugs that interengage respective retaining lugs within the housing. There are gaps between the housing lugs and the target lugs that enable the target to be passed axially into and out of the housing upon rotation to a predetermined rotational position. Likewise, rotation to another rotational position causes the housing lugs to overlie the target lugs to prevent axial movement of the target out of the housing. A plurality of eccentric bolts are provided for axially moving the retaining lugs toward and away from the lugs of the target. Thus, a positive locking of the target can occur. The housing also includes various cooling channels through which cooling fluid flows to counteract the effects of the high temperature plasma generated by energizing of the target.

BRIEF DESCRIPTION OF THE DRAWINGS

The foregoing and other objects and advantages of the invention will become more clear with reference to the detailed description as illustrated by the accompanying drawings in which.

DETAILED DESCRIPTION OF THE PREFERRED EMBODIMENT

Figure 3:
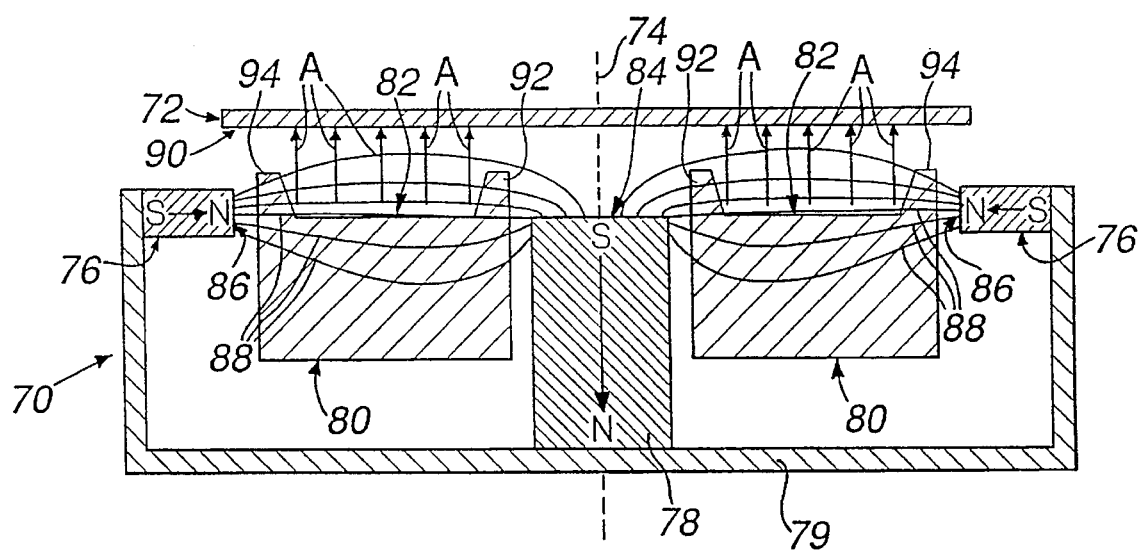
FIG. 3 is a somewhat schematic side cross section of a magnet and target configuration for a magnetron sputtering cathode assembly according to this invention.

A magnet and target configuration for a magnetron cathode sputtering apparatus according to a preferred embodiment of this invention is detailed in FIG. 3. The magnet assembly 70, shown schematically, is adapted for applying material to a circular substrate 72 that can comprise a conventional compact disc (CD) according to this embodiment. The circular substrate 72 has a central axis 74 that is aligned with the center of the magnet assembly 70. It is contemplated, however, that the structure shown and described herein can be ovular, rather than circular, for sputtering a variety of substrate shapes.

As depicted, the magnet assembly 70 comprises an outer ring magnet 76 and inner cylindrical magnet 78 located coaxially about the center axis 74. The magnet assembly 70 includes outer and inner permanent magnets 78, 76, respectively, having North-to-South magnetic orientations aligned perpendicularly to one another. The outer ring magnet 76 includes a North-to-South pole (N-S) orientation that is aligned parallel to the plane defined by the substrate 72. It is generally contemplated that the outer magnet define a closed-loop of magnetic material regardless of perimeter shape to maintain electron drift around the structure. Conversely, the inner magnet 78 includes a North-to-South pole (N-S) orientation aligned perpendicularly to the plane defined by the substrate 72 and generally parallel with the axis 74. The inner magnet 78 and outer magnet 76 are each mounted to a base 79 constructed from a magnetically-permeable material such as steel.

Figure 1:
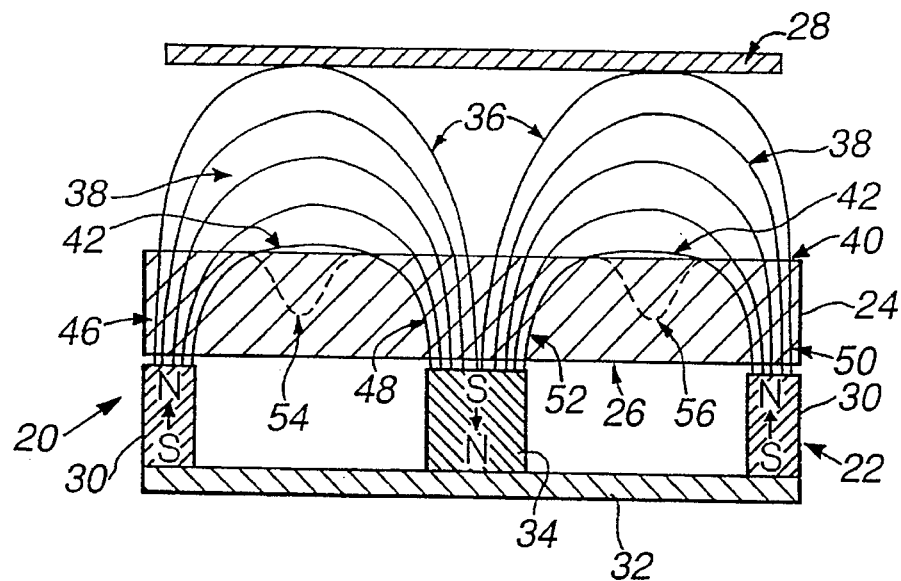
FIG. 1 is a somewhat schematic side cross section of a magnet and target arrangement of a magnetron sputtering cathode assembly according to the prior art.
Figure 2:
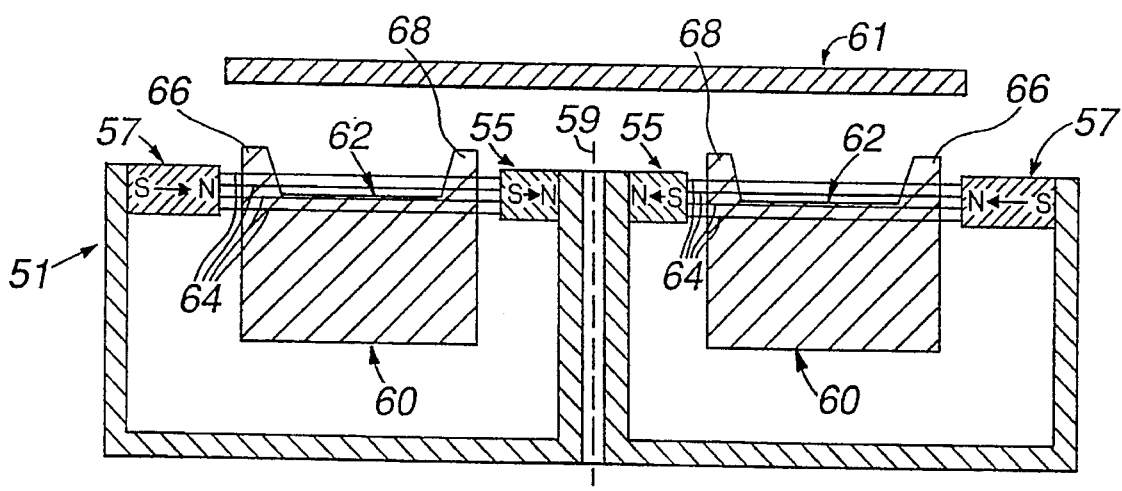
FIG. 2 is a somewhat schematic side cross section of a magnet and target arrangement of another magnetron sputtering cathode assembly according to the prior art.

The target 80 comprises an approximately-rectangular cross section annulus, according to this embodiment. It includes a front or sputtering surface 82 defining a plane that is approximately parallel with the front surface 84 of the inner magnet 78. The outer ring magnet 76 is aligned so that its inner side 86 is transected by the plane defined by the target sputtering surface 82. In general, the magnets of this embodiment are located "aside" the edges of the target rather than "behind" the target as exemplified by FIG. 1.

The orientation of the poles of the outer and inner magnets 76 and 78, respectively, generates a magnetic field therebetween, defined by flux lines 88, that passes through the target cross section and is approximately flat adjacent the sputtering surface 82 of the target 80. Note that the sputtering surface of this embodiment is planar. Such surfaces typically define a plane upon initiation of sputtering. For the purposes of this discussion, it shall be assumed that the sputtering surface shall approximately define a plane. Other directions shall be taken with reference to this plane. However, where the sputtering surface shall be nonplanar, the term plane shall refer to a plane passing through a forward face of the sputtering surface and approximately perpendicular with a direction in which sputtered target material is meant to travel.

The flux lines, forwardly of the sputtering surface 82 of the target 80 (and below the substrate deposition surface 90) define an arch over the target sputtering surface 82. The flux lines 88 within the target, likewise, define an arch that projects into the target in a direction away from the sputtering surface 82.

The target according to this embodiment includes a pair of inner and outer raised walls 92 and 94, respectively, through which the magnetic field flux lines 88 pass. When a sufficient voltage (approximately 600 VDC) is applied to the target 80, a plasma is generated adjacent the sputtering surface 82. The plasma is contained within the area of the target by the flux lines 88 and the walls 92 and 94. Ejected atoms of target material passes through the plasma along paths defined generally by arrows A onto the surface 90 of the substrate 72, causing the surface to be coated with the target material.

A relatively flat magnetic field flux line is defined adjacent the sputtering surface 82 in a preferred embodiment. However, the positioning of the flux lines of the magnetic field according to this embodiment can be utilized to alter the area of erosion of the target. For example, by moving the outer magnet 76 further toward the substrate 72, the erosion pattern can be moved toward the outside of the target. Since a larger volume of target material is located radially outwardly on the target 72, axial relocation of the ring magnet 76 can enable more efficient utilization of the target. Additionally, by varying the intensity of the outer magnet 76, similar variations in erosion pattern can be obtained. The relative locations of the magnets 76 and 78 and their intensities (described further below) can, thus, be varied to obtain an optimum erosion pattern for a given target shape, size and materials. The parameters according to this embodiment are, therefore, preferred primarily for the target described and depicted.

Figure 4:
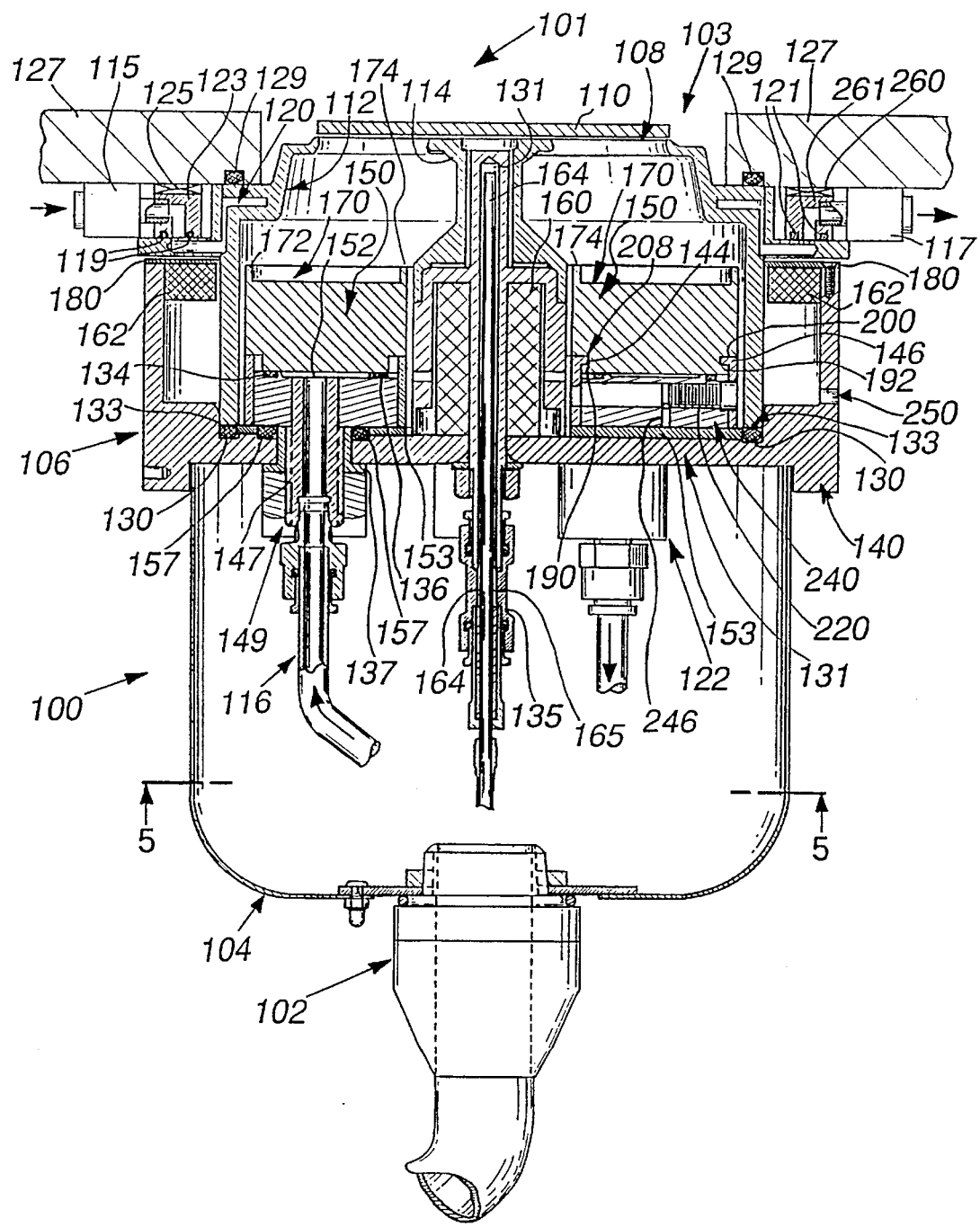
FIG. 4 is a side cross section of a specific embodiment of a magnetron sputtering cathode assembly according to this invention.
Figure 5:
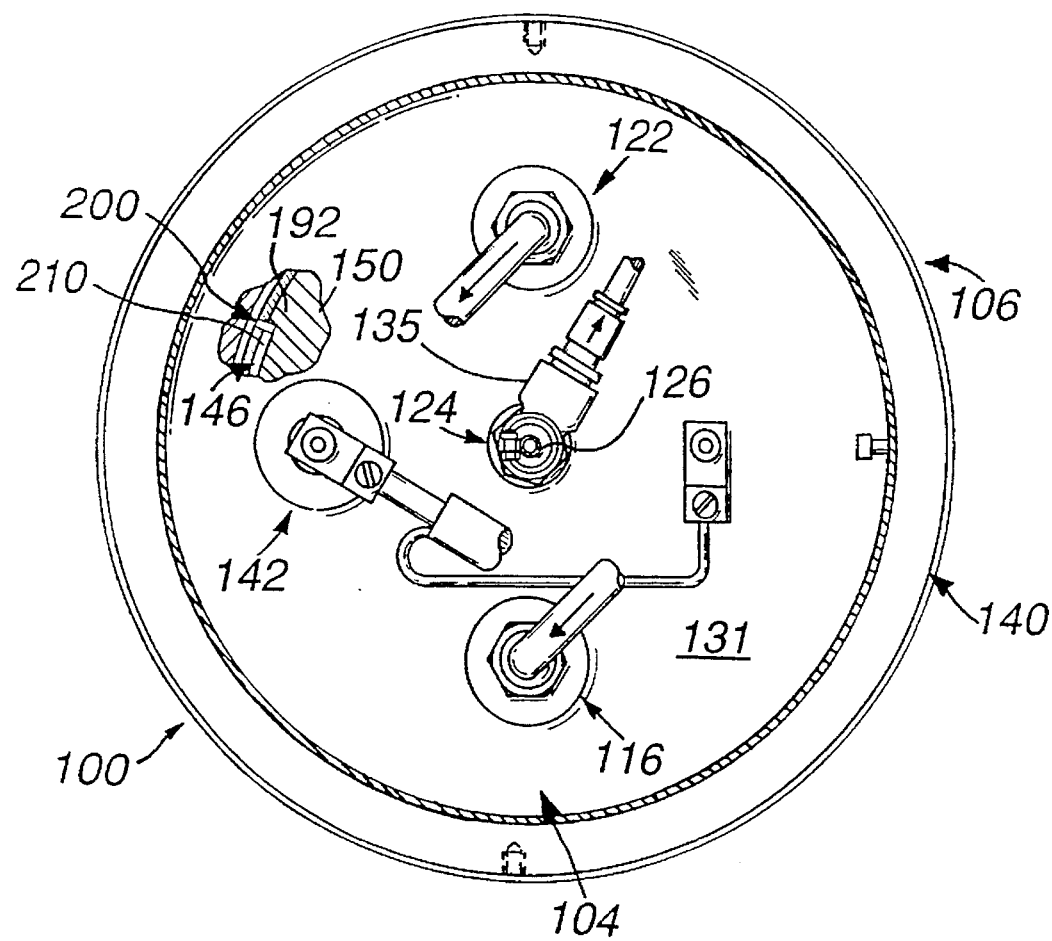
FIG. 5 is a top cross section of the magnetron sputtering cathode assembly taken along line 5—5 of FIG. 4.
Figure 6:
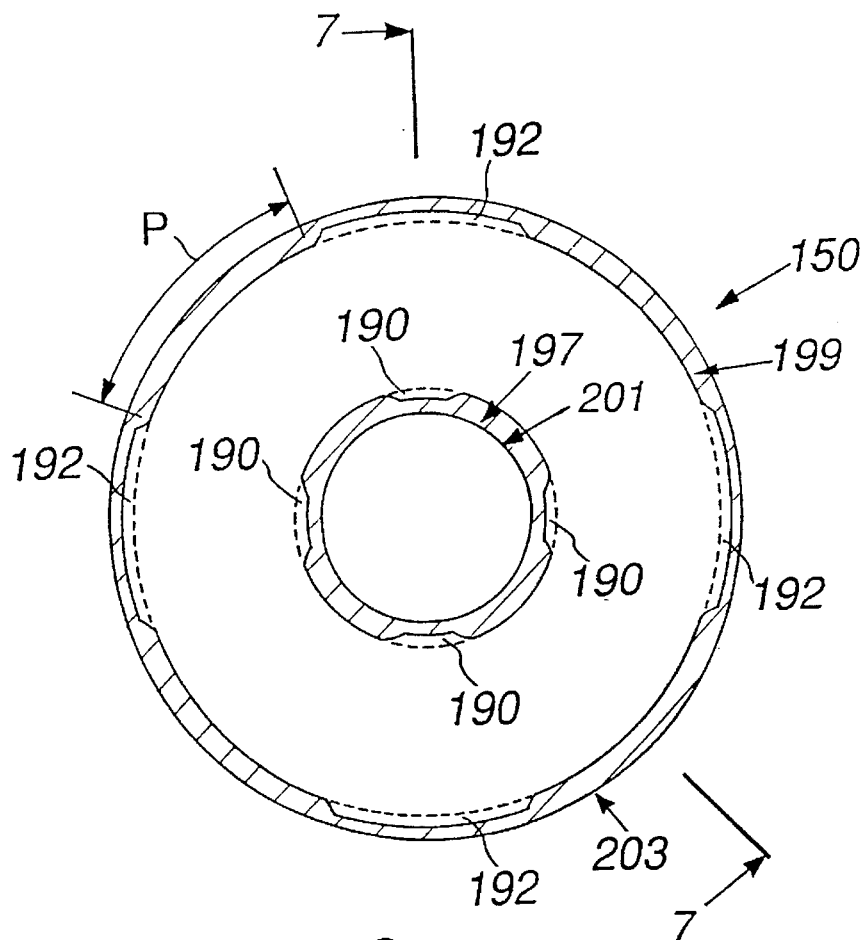
FIG. 6 is a bottom plan view of a sputtering target according to this invention.

A magnetron sputtering cathode assembly utilizing the magnet configuration, substantially of the type detailed in FIG. 3, according to a preferred embodiment, is shown in greater detail in FIGS. 4 and 5. The cathode assembly 100 is interconnected with a vacuum chamber 101 at an opening 103 in the chamber 101. As discussed above, a vacuum of $10^{-3}$ Torr is maintained and Argon gas is present in the chamber according to this embodiment.

The cathode assembly 100 includes a feed cable 102 that carries cooling water and power, a cathode cover 104 that encloses the power and cooling water feed connections and a sputtering assembly 106 that houses the target 150 and receives substrate elements (conventional compact discs in this example) at a frontmost end 108. It is contemplated that the front end 108 is mounted in a vacuum chamber (not shown) to facilitate the migration of sputtering material onto the surface of the substrate 110. The substrate 110 is typically brought into contact with the front end 108 by a cup-like structure of conventional design (also not shown) that transfers substrates 108 to and from conventional storage magazines.

The substrate 110 is supported relative to the sputtering assembly 106 on a generally cylindrical outer mask 112 and a generally cylindrical inner mask 114. The outer mask 112 is constructed from stainless steel according to a preferred embodiment. The inner mask 114 is constructed from copper. Other materials having suitable resistance to a high temperature plasma can be substituted for the masks. The inner mask 114 and outer mask 112 prevent migration of target material onto the inner and outer areas of the substrate, ensuring a smooth transition between coated and uncoated substrate areas. For example, a compact disc is uncoated at its center and outer edge. The masks 112 and 114 facilitate such a pattern by blocking the migration of excess target material. The masks must occasionally be cleaned to remove any excess.

To prevent mask or substrate damage, the outer mask 112 and the inner mask 114 each receive circulated cooling fluid to counteract the extreme temperatures generated by the sputtering process. Water or another suitable coolant, such as ethylene glycol, can be utilized according to this embodiment. The outer mask 112 is cooled by cooling water from an inlet 115. The water is routed through a channel 120 in the outer mask 112 that surrounds the perimeter of the outer mask. Water exits through an opposing outlet 117. The inlet 115 and outlet 117 are engaged to the mask 112 with quick-disconnect water fittings 123 and 261. The mask 112 is sealed to the water fittings 123 and 261 by O-rings 119 and 121, respectively. These fittings 123 and 261 are biased toward the mask 112 by springs 125 and 260, respectively. Likewise, the mask 112 is sealed against the vacuum chamber walls 127 with an O-ring 129.

Similarly, the inner mask 114 receives cooling water from a central cooling assembly 124 (FIG. 5). Water passes along the central axis through a central cooling channel 125 and returns through a coaxial channel that communicates with cooling outlet assembly 126 (FIG. 5). As depicted generally in FIG. 4, the inner magnet 160 defines a hollow center that houses the coaxial cooling channel 164. Water passes from the center channel to the outer channel 165 at the front end 131 of the channel. The outer cooling channel 165 is joined with a T-connector 135 that enables cooling water to exit the outer cooling channel 165.

The O-ring 130 forms a seal between the sputtering assembly base plate 131 and the lower rim 133 of the outer mask 112. This ring enables a vacuum to be maintained within the interior of the outer mask 112 and the vacuum chamber 101 to which it is connected.

The O-rings 134 and 136 are located at the rear side of the sputtering target 150 according to this invention. The cooling water from inlet assembly 116 is channeled into the cavity 152 behind the target 150 and provides cooling to the target 150 during plasma generation. Water circulates around the base of the target and exits through the cooling outlet 122. The inlet 116 and outlet 122 are each provided as take-offs that project through the sputtering assembly base 131 (See also FIG. 5) These take-offs are insulated from the base plate by an insulating grommet (137 for inlet 116).

The base plate 131 is part of an overall machined steel outer shell or housing 140. The elements of the sputtering assembly 106 are mounted on the housing 140. As described further below, the housing 140 is constructed from a magnetically permeable material (steel). It is in direct contact with the magnets (160, 162) of this embodiment and forms a bridge between them.

The target 150 is electrically isolated from the housing 140. The housing, conversely, forms part of the grounded anode with the vacuum chamber according to this embodiment. An insulator 153 is located on the base plate 131. It insulates the grounded base plate from a target base 240. The target base 240 is constructed in the form of a ring from conductive material such as steel. The target base 240 includes stems (147 for inlet 116) that project through the base 240 and outwardly from the base plate 131. The stems 147 define open passageways to allow coolant to pass through the thickness of the base 240 so that coolant can communicate with the rear of the target 150. The stems 147 enable attachment of the inlet 116 and outlet 122 take-offs using a pressure fitting 149 or similar coupling device.

The target base 240 is also interconnected with a power take-off 142 (FIG. 5) that passes through the base plate 131 and contacts the target base 240 along the rear side of the base 240. The power take-off 142 is insulated from the base plate 131 by a grommet-shaped insulator similar to the insulator 137 provided to the take-off hole of the cooling inlet 116. The insulators used according to this embodiment can be constructed from any appropriate insulating material such as Delrin®, Teflon®, fiberglass, rubber or other insulating compounds. Note that the target base 240 is also sealed relative to each of the take-off holes in the base plate 131 by an O-ring (such as O-ring 157 for inlet 116) to prevent air infiltration through any take-off hole.

The target base 240 is electrically interconnected with the target 150 by a set of target retaining or mounting rings 144 and 146. These rings engage the inner and outer perimeters of the target and are described further below.

The target 150 is energized with approximately 600 volts DC during sputtering. In the presence of an Argon-filled vacuum chamber, this cathode voltage is sufficient to generate a plasma according to this embodiment.

The outer shell 140 also supports the inner magnet 160 and the outer magnet 162 according to this invention. The inner magnet 160 comprises cylinder having an outer diameter of approximately 1.4 inches, an inner diameter of approximately 0.50 inch (for coolant passage) and a length of approximately 2.12 inches. The magnet 160, according to this invention, can be formed preferably from a Neodymium-Iron-Boron material available, for example, from the Cookson Magnet Company, having stock numbers 35, 35H, 37, 39H, 40, 42H or 45 and a B constant of between 12,300 and 13,500 gauss.

The outer ring magnet 162, according to this embodiment, is constructed from a plurality of flexible magnetic strips that are assembled together on a cylindrical form to create the large laminated ring magnet shown in FIG. 4. The strips are available from the Electrodyne Company under the trademark Reance 90. Each strip is 0.030 inch thick and 0.5 inch in width, the strips having $B_r$ constant of approximately 6,500 gauss. The completed outer magnet 162 is approximately 0.625 in cross sectional width and has a maximum outer diameter of approximately 8.75 inches and a height of approximately 0.5 inch. When mounted in the housing 140, the outer ring magnet 162 is provided with a magnet shield 180 in the shape of a ring that covers the ring magnet where it faces the outer mask 112.

As discussed generally with reference to FIG. 3 and magnets 78 and 76, respectively, the inner magnet 160 and outer magnet 162 are oriented so that the inner magnet is polarized substantially perpendicular to the plane of the substrate 110 and the plane of the target sputtering surface 170. The outer magnet 162 is polarized substantially parallel to the plane of the substrate 110 and sputtering surface 170. Hence, the magnets 160 and 162 generate a magnetic field having flux lines as defined generally in FIG. 3 with a relatively parallel flux line passing across the sputtering surface 170 of the target 150. The use of such a field facilitates relatively even erosion of the target 150 across its entire surface enabling longer target life and, hence, less idle time due to target replacement.

Figure 7:
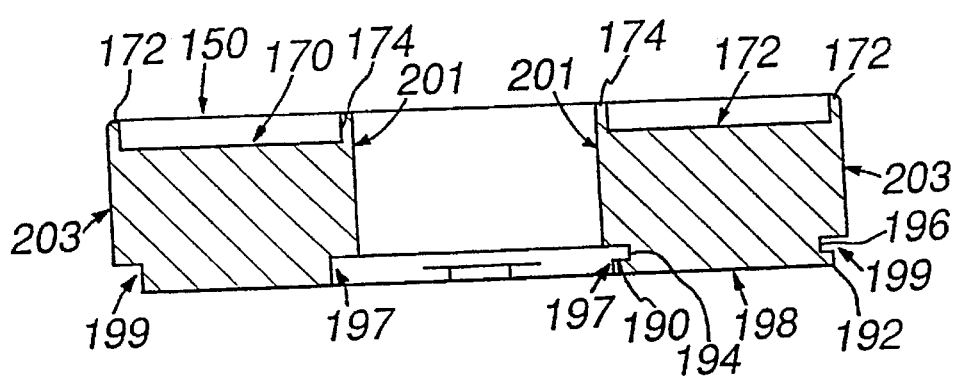
FIG. 7 is a side cross section of the target taken along line 7—7 of FIG. 6.
Figure 8:
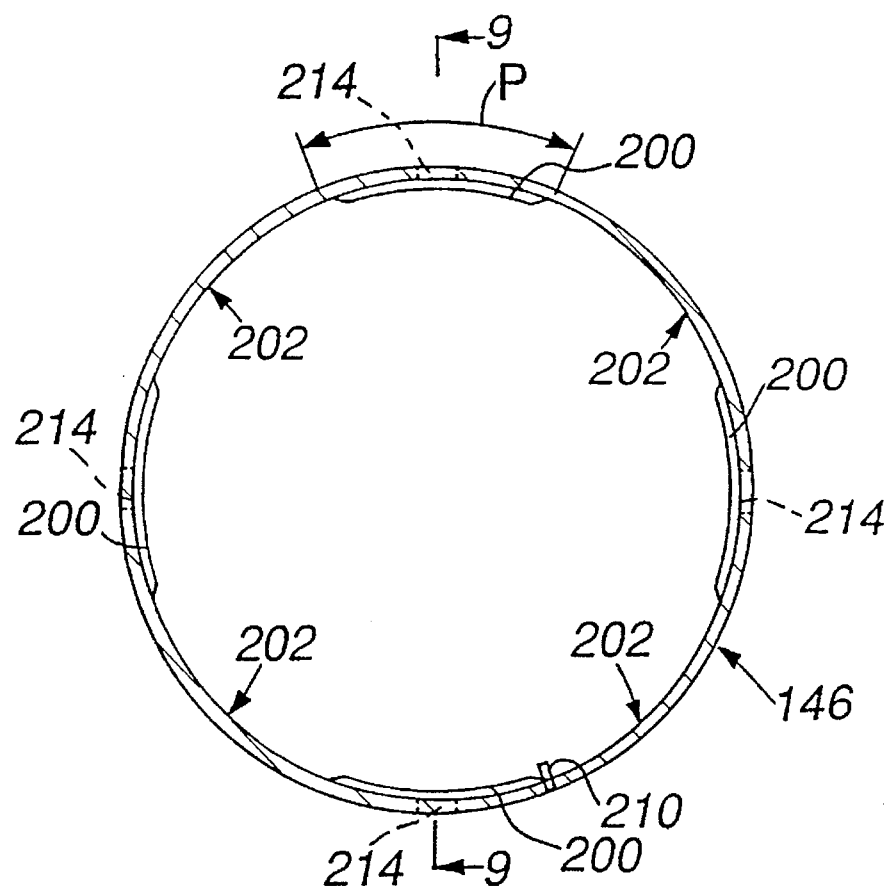
FIG. 8 is a plan view of an outer retaining clamp for retaining the target of FIG. 7.
Figure 9:
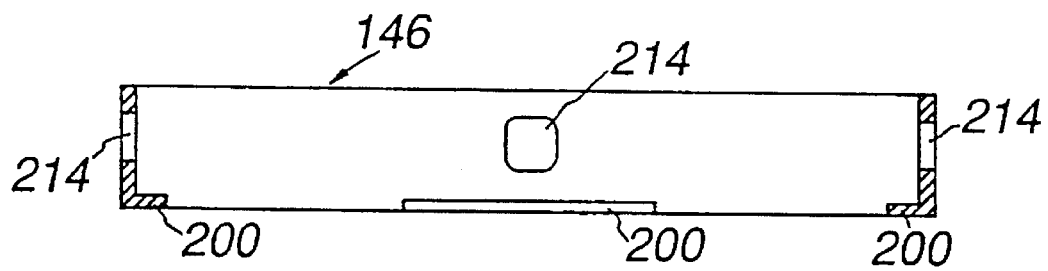
FIG. 9 is a side cross section of the outer retaining clamp taken along 9—9 of FIG. 8.
Figure 10:
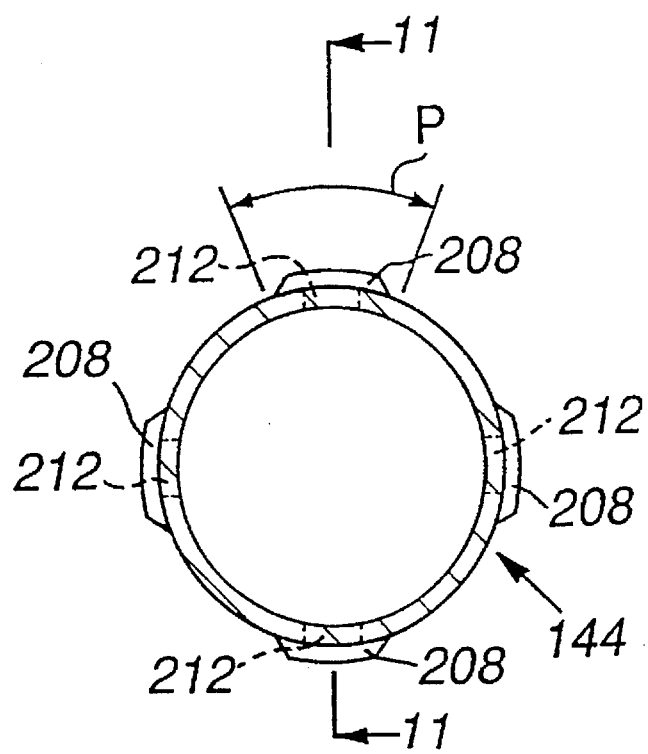
FIG. 10 is a plan view of an inner retaining clamp for retaining the target of FIG. 7.
Figure 11:
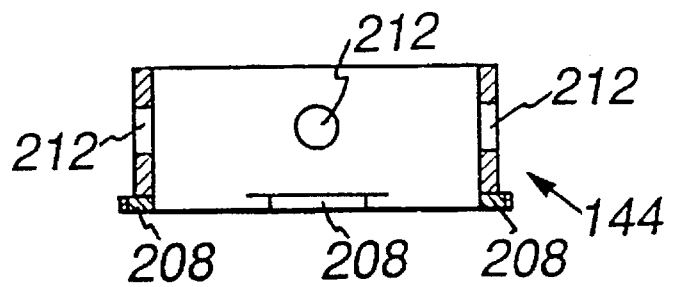
FIG. 11 is a side cross section of the inner retaining clamp taken along line 11—11 of FIG. 10.
Figure 12:
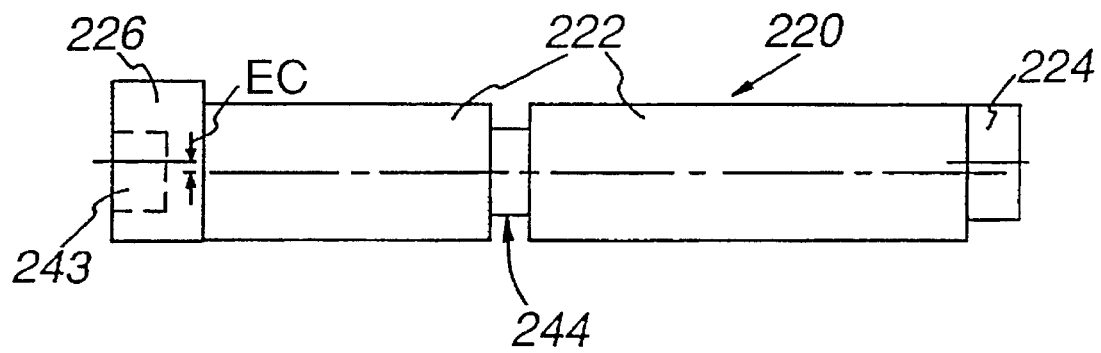
FIG. 12 is a side view of an eccentric locking bolt for use with the retaining clamp and target assembly according to FIGS. 7–11.
Figure 13:
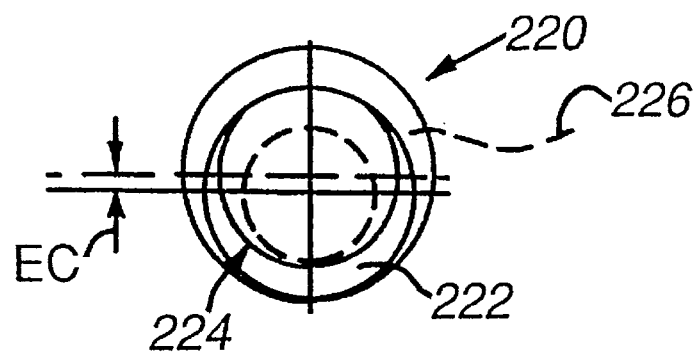
FIG. 13 is an end view of the bolt of FIG. 12.

To contain the plasma generated above the sputtering surface 170, the target 150 includes a pair of raised walls 172 and 174 (see also FIG. 7) through which flux lines of the magnetic field pass. The walls 172, 174, according to this embodiment, are spaced from each other at a radial distance of approximately 2 inches. The walls 172 and 174 are approximately 3/16 inch thick and are approximately 0.25 inch in height from the sputtering surface 170. The walls 172 and 174 and other target structures can be formed, according to this embodiment, by machining a solid billet of 6061 aluminum alloy.

The orientation of magnetic fields according to this invention extends the life of the target and reduces idle time between target replacement. Idle time is further reduced by an improved retaining mechanism that enables rapid target attachment and detachment according to this invention. With further reference to FIGS. 6–13 the target 150 (FIGS. 6 and 7) includes inner lugs 190 and outer lugs 192 that radially project from the respective recessed rims 197 and 199 on the rear side 198 of the target 150. Four inner lugs 190 and four outer lugs 192 are provided on the rims. The lugs 190 and 192 have a height of approximately 0.12 inch. They radially extend approximately 0.125 inch from their respective recessed rims 197 and 199. The recessed rims 197 and 199 are radially recessed approximately 0.25 inch from the inner edge 201 and the outer edge 203, respectively, of the target 150. The lugs 190, 192 span an arc P which, according to this embodiment, is approximately 45°. The lugs 190 and 192 are centered at 90° angles relative to each other. However, it is contemplated that a larger or smaller number of lugs can be utilized according to this invention and that the lugs can be spaced at a variety of circumferential locations relative to each other.

The outer retaining ring or base 146 (FIGS. 8 and 9) includes corresponding lugs 200 that face radially inwardly and are constructed to interengage with the outer lugs 192 of the target 150. The retaining ring lugs 200 are also located at 90° intervals about the ring 146. The lugs 200, similarly, encompass an arc P of 45°. The lugs 200 are sized and shaped similarly to the target's outer lugs 192. The target 150 can pass axially with its outer lugs 192 positioned between the retaining ring lugs 200 in the corresponding retaining ring spaces 202, because spaces 202 also trace a 45° arc. Thus, the spaces 202 are sized to accommodate the outer lugs 192 of the target 150. Similarly, the inner retaining ring or base 144 (FIGS. 10 and 11) also includes a set of four lugs 208 that project radially outwardly and are spaced at 90° intervals about the circumference of the inner retaining ring 144. These lugs each trace an arc P of 45° about the ring's circumference and are aligned with the lugs 200 of the outer ring. Thus, the inner lugs 190 of the target can pass axially between the inner ring lugs 208 at the same time that the outer target lugs 192 pass between the outer ring lugs 200. Accordingly, the orientation of the inner and outer retaining rings 144 and 146, respectively, establishes a release position, in which the target lugs pass between the corresponding retaining ring lugs and a retained position in which the retaining ring lugs interengage the target lugs. These positions are selectable by rotating the target. As detailed in FIG. 5, a retaining pin 210 is provided in the outer ring (see also FIG. 8). The retaining pin limits rotation since the retaining pin 210 binds upon one of the outer target lugs 192. The retaining pin 210 enables rotation of the target by approximately 45° between the fully-retained and a fully-removable circumferential orientation.

To attach or remove a target, one aligns the target lugs 190 and 192 with the spaces between retaining ring lugs 208 and 200, respectively, and moves the target 150 through the retaining ring structure in an axial direction (perpendicular to the plane of the target sputtering surface 170). To lock the target 150 one rotates the target until the target lugs 190 and 192 are brought into full interengaging contact with the retaining ring lugs 208 and 200, respectively, and the retaining pin 210 restricts further rotational movement.

For further target security, the retaining rings 144 and 146 according to this embodiment are provided with respective holes 212 and 214. The holes 212 and 214 receive ends of an eccentric bolt 220 (FIGS. 12 and 13) having a central shaft 222, an inner end 224 and an outer head 226 that are each eccentrically located relative to the central shaft 222. The outer shaft diameter is approximately 0.315 inch. The eccentricity EC is approximately 0.025 inch. The head 226 of the bolt 220 according to this embodiment includes a recess for an Allen wrench or similar torque-transmitting adjustment tool. By rotating the bolt 220 the inner and outer retaining rings 144 and 146 can be moved toward and away from the target 150. The bolt is secured within the base 240 upon which the target 150 rests. Hence, the rings 144 and 146 float relative to the base 240 and enable the target to be pressed tightly against the base 240. The locking action of the rings 144 and 146 also causes the O-rings 134 and 136 to seal against the bottom surface of the target 150.

A circumferential recess 244 (FIG. 12) is provided in the bolt 220. The recess 244 interengages a locking pin 246 (FIG. 4) to prevent axial movement of the bolt once it is mounted within the base 240. Rotational movement of the bolt 220 about the pin 246 is enabled. Four bolts (220) are provided at 90° intervals adjacent each of the retaining ring lugs. To attach or remove a target 150 the user must rotate each of the bolts so that the retaining rings 144 and 146 are moved upwardly toward the target (away from the base 240) enabling the target to be rotated. The retaining ring lugs 200, 208 can be engaged or disengaged from the target lugs 190, 192 during such rotation. When the lugs 190, 192 of a target are located in an interengaging relationship with the retaining ring lugs 200, 208, the bolts are turned to translate the retaining rings 144 and 146 toward the base 240 and the target is secure within the sputtering apparatus. Note that access to each bolt is gained through a hole 250 (FIG. 4) on the side of the outer shell 140. However, to move a target 150 into or out of the sputtering assembly 106, the outer mask 112 must generally be separated from the outer shell 140. The water jacket's quick release assembly (described above) facilitates separation of the outer mask 112. It should be clear that removal and attachment of targets according to this embodiment requires relatively few steps and, with practice, can be accomplished rapidly and precisely.

The foregoing has been a detailed description of a preferred embodiment. Various modifications and additions to this embodiment are contemplated and are believed to be within the scope of the invention. This description is, therefore, meant to be taken only by way of example and to otherwise limit the scope of the invention. For example, while screws are utilized to attach various components, clips or clamps can be utilized, while lugs are preferably used as an engagement or retaining means for attaching the target to the housing, other quick-disconnect attachments can be used. For example, spring or resilient clips, bayonet fasteners or other joiners can be employed. In all cases, the housing of this invention can be made to permit quick, unobstructed, access to the target for replacement. Similarly, the magnet materials utilized herein can be substituted with other magnetic materials having similar properties. Likewise, while the substrate of this embodiment is located adjacent the opening defined by the sputtering assembly 106, it is contemplated that an article to be coated with target material can be located remote form the opening. Such an article can be of any shape and can be located in the vacuum chamber at any position that places it in the path of sputtering material. In fact, the article can be omitted and sputtering into the chamber will still occur. Finally, while the structures of FIG. 4 are generally cylindrical about a central axis, it is contemplated that other shapes, such as ovals and multisided shapes can be used.

What is claimed is:

1. A magnetron cathode sputtering apparatus for depositing sputtered target material onto a substrate, comprising:

an anodic structure constructed and arranged to communicate with a vacuum source;

an annular target, having opposing edges that define an outer circumference and an open center section, said target being located adjacent said anodic structure, said target having a sputtering surface that approximately defines a plane and from which target material migrates to said substrate and said target also having a pair of raised walls extending from said sputtering surface at said opposing edges of said target;

a voltage source for generating a plasma at said sputtering surface;

a first magnet and a second magnet, each of said first magnet and said second magnet being located adjacent and aside a respective one of said opposing edges of said target, said first magnet being located within said center section and said second magnet defining an annulus that surrounds said outer circumference and said first magnet and said second magnet being mounted on a housing of magnetically permeable material; and said first magnet and said second magnet each having a free end, and an opposing end mounted on said housing, the free end of said first magnet being located approximately in line with the plane defined by said sputtering surface and said first magnet having a North-to-south magnetic orientation that is oriented in a line substantially perpendicular to said plane and with a South pole closer to said plane and a North pole more remote from said plane and closer to said housing, and wherein said second magnet has a North-to-South magnetic orientation that is oriented in a line substantially parallel with said plane defined by said sputtering Surface and said second magnet is approximately aside said plane so that a portion of said plane passes through said second magnet and wherein said second magnet includes a North pole located more closely to said free end and wherein said South pole is located remote from said free end more closely to said housing, wherein said first magnet and said second magnet together define a magnetic field having flux lines that form a closed-loop array of magnetic flux lines through said raised walls and over said sputtering surface to maintain said plasma adjacent said sputtering surface.

2. The apparatus as set forth in claim 1 wherein said ring comprises a plurality of strips of flexible magnetic material joined into a laminated ring magnet.

3. The apparatus as set forth in claim 1 wherein the housing includes a plurality of channels for receiving cooling fluid and wherein said target is interconnected with said cooling channels.

4. The apparatus as set forth in claim 3 wherein the housing includes an inner mask and an outer mask for covering respective inner and outer portions of a substrate surface to prevent migration of target material onto said inner and outer portions and wherein said cooling channels are interconnected with said inner mask and said outer mask.

5. The apparatus as set forth in claim 4 wherein said cooling channels include a central cooling channel that passes through said first magnet, said central cooling channel having an inner passage, a coaxial outer passage and a bridge passage between said inner passage and said coaxial outer passage and wherein cooling fluid passes between said inner passage and said outer passage through said bridge passage.

6. The apparatus as set forth in claim 1 wherein said vacuum source comprises a vacuum chamber having an opening and wherein said anodic structure is interconnected with said opening.

7. The apparatus as set forth in claim 1 wherein said annular target includes a plurality of lugs located about said outer circumference of said annular target and wherein said housing includes a plurality of interengaging lugs and wherein said target is rotatable relative to the housing so that said lugs of said target selectively engage and disengage said lugs of said housing to enable ease of replacement of said target.

8. The apparatus as set forth in claim 7 further comprising an eccentric bolt that is rotatable to move said lugs of said housing axially toward and away from said lugs of said target to selectively secure said target to said housing.

9. The apparatus as set forth in claim 1 wherein said anodic structure includes a location for supporting a substrate in a facing relationship with said target.

10. The apparatus as set forth in claim 9 wherein said location is constructed and arranged for supporting a substantially planar disc-like substrate.

11. A method for sputtering target material onto a substrate, comprising the steps of:

providing a target having a sputtering surface, the sputtering surface comprising an annulus having opposing inner and outer edges that define an open center section and an outer circumference, the target being located adjacent the substrate so that said sputtering surface of said target approximately defines a plane in an orientation that faces the substrate, said target being located within a vacuum;

orienting a first magnet and a second magnet aside each of said opposing edges of said sputtering surface including orienting said first magnet so that a North-to-South magnetic orientation of said first magnet is aligned substantially parallel to said plane defined by said sputtering surface and a North-to-South orientation of said second magnet is aligned substantially perpendicular to said plane defined by said sputtering surface, said step of orienting including mounting each of said first magnet and said second magnet on a magnetically permeable material housing, each of said first magnet and said second magnet being oriented so that a free end is positioned approximately within said plane defined by said sputtering surface and wherein the step of mounting further includes mounting each of the first magnet and the second magnet so at least one of the first magnet and the second magnet includes a South pole more closely located to said housing while the other of said first magnet and said second magnet includes a North pole more closely located to said housing;

providing a pair of walls at said sputtering surface that extend from said sputtering surface at each of said opposing edges toward said substrate, wherein said walls, said first magnet, and said second magnet define a magnetic field having flux lines that form a closed-loop array of radial magnetic flux lines with said flux lines passing from a North pole of one of said first magnet and said second magnet through said walls and above said sputtering surface to a South pole of the other of said first magnet and said second magnet applying a voltage to said target to generate a plasma at said sputtering surface, said plasma being substantially contained adjacent said sputtering surface by said magnetic field; and wherein said step of orienting said first magnet includes providing a ring magnet adjacent the outer circumference and said step of orienting said second magnet includes providing a magnet within said open center section.

12. The method as set forth in claim 11 further comprising detachably retaining said target relative to said housing with interengaging lugs located on each of said housing and said target.

13. The method as set forth in claim 12 further comprising providing gaps between said lugs on each of said target and said housing and rotating said target relative to said housing so that said gaps of each of said target and said housing are aligned with respective lugs on each of said housing and said target, wherein said target can pass axially into and out of said housing.

\* \* \* \* \*